United States Patent
Kwak et al.

(10) Patent No.: US 8,294,247 B2
(45) Date of Patent: Oct. 23, 2012

(54) HIGH-POWER DEVICE HAVING THERMOCOUPLE EMBEDDED THEREIN AND METHOD FOR MANUFACTURING THE SAME

(75) Inventors: Chang-Soo Kwak, Daejon (KR); Man-Seok Uhm, Daejon (KR); In-Bok Yom, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 233 days.

(21) Appl. No.: 12/442,883

(22) PCT Filed: Sep. 17, 2007

(86) PCT No.: PCT/KR2007/004473
§ 371 (c)(1),
(2), (4) Date: Mar. 25, 2009

(87) PCT Pub. No.: WO2008/038922
PCT Pub. Date: Apr. 3, 2008

(65) Prior Publication Data
US 2010/0090329 A1    Apr. 15, 2010

(30) Foreign Application Priority Data
Sep. 28, 2006    (KR) .................. 10-2006-0094656

(51) Int. Cl.
*H01L 23/495*    (2006.01)
*H01L 31/058*    (2006.01)
*H01L 23/52*    (2006.01)

(52) U.S. Cl. ........ 257/675; 257/467; 257/469; 257/470; 257/691; 257/E23.08

(58) Field of Classification Search .................. 257/467, 257/468, 469, 470, 675, 690, 691, E31.131, 257/E23.08, E21.53
See application file for complete search history.

(56) References Cited

U.S. PATENT DOCUMENTS

| | | | | |
|---|---|---|---|---|
| 4,429,413 A | * | 1/1984 | Edwards | 382/124 |
| 4,445,034 A | * | 4/1984 | Tomita et al. | 250/338.3 |
| 5,245,510 A | | 9/1993 | Honda | |
| 5,251,981 A | | 10/1993 | Kreider | |
| 5,528,446 A | * | 6/1996 | Sankaran et al. | 361/25 |
| 5,596,219 A | * | 1/1997 | Hierold | 257/467 |
| 5,629,482 A | * | 5/1997 | Vaitkus et al. | 73/204.24 |
| 5,830,372 A | * | 11/1998 | Hierold | 216/2 |
| 5,940,526 A | * | 8/1999 | Setlak et al. | 382/124 |

(Continued)

FOREIGN PATENT DOCUMENTS
JP        03-195930 A        8/1991
(Continued)

OTHER PUBLICATIONS
International Search Report: mailed Dec. 31, 2007; PCT/KR2007/004473.

*Primary Examiner* — Teresa M Arroyo
(74) *Attorney, Agent, or Firm* — Ladas & Parry LLP (57) ABSTRACT

Provided is a high-power device having a thermocouple (thermoelectric couple) for measuring the temperature of a transistor constituting a high-power device. The high-power device includes a heating element, a thermocouple formed adjacent to the heating element, and a dielectric body formed between the heating element and the thermocouple.

4 Claims, 5 Drawing Sheets

U.S. PATENT DOCUMENTS

| | | | |
|---|---|---|---|
| 6,013,935 A * | 1/2000 | Shie | 257/469 |
| 6,055,148 A * | 4/2000 | Grover | 361/103 |
| 6,300,554 B1 * | 10/2001 | Du et al. | 136/201 |
| 6,335,478 B1 * | 1/2002 | Chou et al. | 136/201 |
| 6,633,656 B1 * | 10/2003 | Picard | 382/124 |
| 7,525,092 B2 * | 4/2009 | Watanabe | 250/338.1 |
| 7,795,605 B2 * | 9/2010 | Habib et al. | 257/2 |
| 7,902,625 B2 * | 3/2011 | Anderson et al. | 257/467 |
| 2003/0082842 A1 * | 5/2003 | Hwu et al. | 438/54 |
| 2003/0148620 A1 * | 8/2003 | Chavan et al. | 438/706 |
| 2004/0208345 A1 * | 10/2004 | Chou et al. | 382/124 |

FOREIGN PATENT DOCUMENTS

| | | |
|---|---|---|
| JP | 05-326824 A | 12/1993 |
| JP | 06-258149 A | 9/1994 |
| JP | 07-218348 A | 8/1995 |
| JP | 2005-278339 A | 10/2005 |
| JP | 2006-013026 A | 1/2006 |
| KR | 1020000059127 A | 10/2000 |
| KR | 1020010110371 A | 12/2001 |
| KR | 1020020093474 A | 12/2002 |
| KR | 1020030096461 A | 12/2003 |

* cited by examiner

HIGH-POWER DEVICE HAVING THERMOCOUPLE EMBEDDED THEREIN AND METHOD FOR MANUFACTURING THE SAME

TECHNICAL FIELD

The present invention relates to a high-power device, specifically, to a method for measuring the temperature of a heating element constituting a high-power device; and, more particularly, to a high-power device having a thermocouple (thermoelectric couple) for measuring the temperature of a transistor constituting a high-power device.

BACKGROUND ART

A high-power device generating a great deal of heat due to high power consumption has the problem that the function of the device is deteriorated or stops, or the life span of the device is shortened, by an increased temperature of the device itself. Therefore, an apparatus for easily releasing a great deal of heat in the air, e.g., a heat sink, is mounted on the high-power device, which lowers the temperature by forced convection using a fan.

However, noise and power consumption caused by rotation of a fan should be taken into account in the method using the fan. That is, it is required to adjust the rotational speed of the fan depending on a real-time temperature of the high-power device so as to minimize the noise and the power consumption, rather than equally driving it at the same rotational speed regardless of the temperature of the high-power device.

Moreover, in a system having a high-power device, if the temperature exceeds a pre-determined limit, the operation of the entire system needs to be stopped in order to protect the system.

For this, it is necessary to know a temperature generated from the high-power device in advance in real-time, which is an essential requirement of a portable laptop computer. Therefore, a temperature measuring device for measuring the real-time temperature of a high-power device is mounted at a place adjacent to the high-power device. An example of such a measuring device includes a pad-type temperature measuring device attached on a Central Processing Unit (CPU) of a computer, wherein the temperature of the high-power device is measured in real-time, thereby adjusting the cooling capacity by a cooling apparatus such as a fan.

As described above, in case a temperature has to be monitored in real-time, and for a test for verifying whether the thermal design of the entire system is appropriate or not, the temperature of the high-power device needs to be measured. Thus, it should be checked whether a measured temperature exceeds a maximum temperature set to ensure the normal operation and life span of the high-power device. A conventional temperature measuring method for measuring the temperature of a high-power device as above will be explained below in detail.

Figure 1:
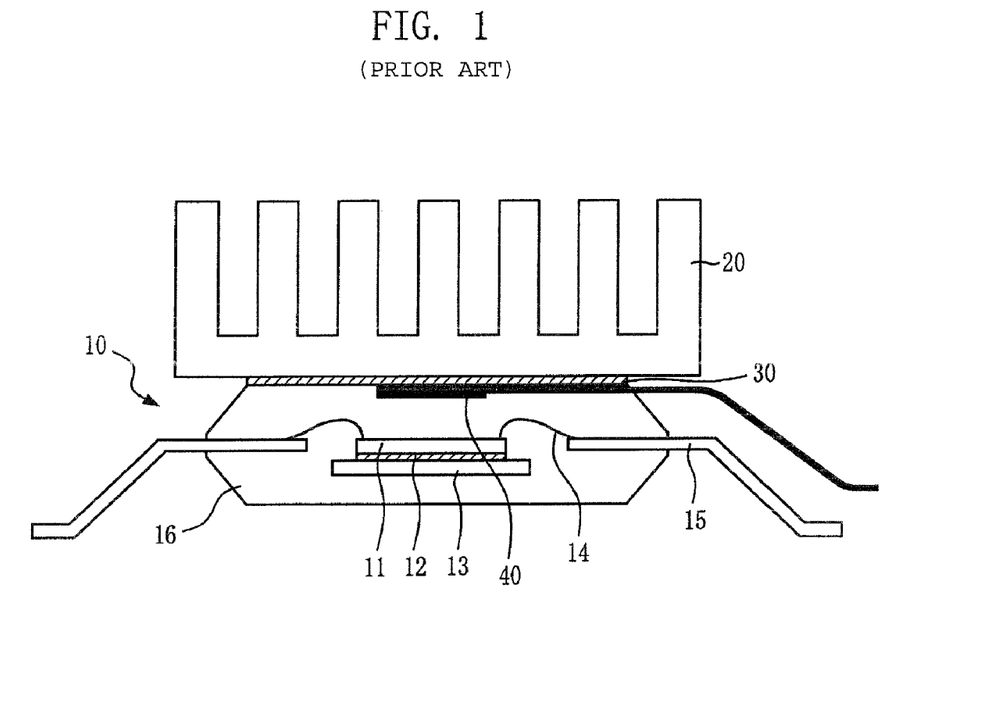
FIG. 1 is a cross-sectional view explaining a conventional method for measuring the temperature of a packaged high-power device.

FIG. 1 is a cross-sectional view schematically showing a temperature measuring device and a heat sink of a packaged high-power device. It shows a conventional method for measuring the temperature of a high-power device.

Referring to FIG. 1, a high-power device 11, which is an essential component of a semiconductor chip 10, is attached to the top surface of a die 13 by a thermally conductive adhesive 12. The high-power device 11 is electrically connected to an external lead 15 through a gold wire 14. Such a high-power device 11 is packaged by a mold compound 16.

A pad-type temperature measuring device 40 for measuring the temperature of the high-power device 11 is attached to the mold compound 16, and a thermally conductive paste 30 is applied to the top thereof, and then a heat sink 20 is placed thereon. The thermally conductive paste 30 is used to make the mold compound 16 and the heat sink 20 thermally well-contacted with each other. At this time, the temperature of the high-power device 10 is higher than the temperature measured by the pad-type temperature measuring device 40, and the difference therebetween is calculated by deriving a thermal resistance from the high-power device 10 to the pad-type temperature measuring device 40, as follows:

$$T_d = T_p + R_{th,d-p} P \qquad \text{Eq. (1)}$$

wherein '$T_d$' is the temperature of the high-power device 11, '$T_p$' is the temperature of the packaging measured by the pad-type temperature measuring device 40, and P is the power consumption of the high-power device 11. And, '$R_{th,d-p}$' the thermal resistance from the high-power device 10 to the pad-type temperature measuring device 40, which is determined by an experiment or analysis.

In this case, however, the accuracy of the calculated temperature of the high-power device is low because of the inaccuracy of the thermal resistance, and the real-time temperature cannot be measured due to the time taken until the thermal energy generated from the high-power device 11 is transmitted to the pad-type temperature measuring device 40.

Figure 2:
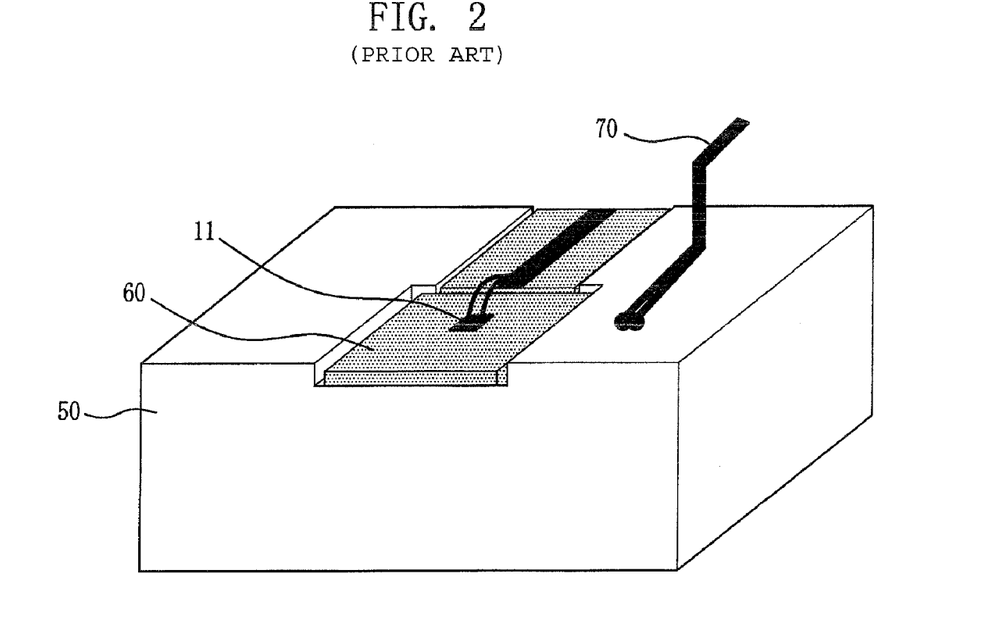
FIG. 2 is a perspective view illustrating a conventional method for measuring the temperature of an unpackaged high-power device.

FIG. 2 is a perspective view showing a semiconductor device having an unpackaged high-power device mounted thereon. In FIG. 2, the reference numerals as in FIG. 1 designate the same or corresponding components.

Referring to FIG. 2, the high-power device 11 is generally attached to an alumina substrate 60, and the alumina substrate 60 is mounted to an aluminium housing 50. Since a temperature measuring device cannot be added to the unpackaged high-power device 11, a wire-type thermocouple 70 is attached to the alumina substrate 60 or to the aluminium housing 50 adjacent thereto. In this case, however, there also exist the inaccuracy of the temperature of the high-power device 11 and the delay of heat transfer, as in FIG. 1. The degree of errors and delay in heat transfer become more serious because there are several steps from the high-power device 11 to a measuring position, including the high-power device 11, an adhesive (not shown) for adhering the high-power device 11 to the alumina substrate 60, the alumina substrate 60, an adhesive (not shown) for adhering the alumina substrate 60 to the aluminum housing 50, the aluminum housing 50, and the thermocouple 70.

Meanwhile, the portion of the high-power device from which most parts of heat are generated is a transistor. Therefore, the performance and life span of the high-power device differs depending on the temperature of the transistor. By the way, regarding the temperature distribution in the high-power device, the size of the high-power device is very small, but the temperature distribution therein is not uniform. That is, while the temperature of a transistor that generates much heat is very high, the temperature of other regions is slightly different from the temperature of the ambient environment, which shows the phenomenon of a local temperature increase. Especially, in case of a high-frequency device using gallium arsenide (GaAs) as a dielectric.

Thus, even if the temperature of the bottom surface of the device has been measured by the method explained in FIGS. 1 and 2, the temperature of the transistor desired to be found ultimately is calculated as:

$$T_j = T_{base} + R_{th,j-b} P \qquad \text{Eq. (2)}$$

wherein '$T_j$' is the temperature of the transistor, '$T_{base}$' is the temperature of the bottom surface of the device, and 'p' is the power consumption of the device. Also, '$R_{th,j-b}$' the thermal resistance from the transistor to the bottom surface of the device, which is determined by an experiment or analysis and provided by the manufacturer of the device.

A representative method, among the methods for obtaining the thermal resistance of an unpackaged high-power device by an experiment, is a method of photographing the temperature distribution of a high-power device by an infrared microscope. That is, this method is to photograph the temperature distribution of the surface of a high-power device while normally operating. However, this method is problematic in that, if the transistor is screened by an air bridge, the temperature of that portion cannot be found, and as the resolution of a microscope does not reach the minimum line width of the device, it is not possible to measure an accurate temperature. Like this, because even a measured thermal resistance may differ according to individual devices, a thermal resistance greater than the actual value is generally provided in consideration of the safety factor. As a result, the temperature calculated with thermal resistance cannot be the accurate temperature of the transistor.

The above description is summarized as follows. In the conventional method for measuring the temperature of a high-power device, if it is desired to know the maximum temperature of a high-power device regardless of whether it is a packaged high-power device or unpackaged high-power device, it is actually difficult to directly measure the maximum temperature from the high-power device in reality. Thus, the maximum temperature is calculated by measuring the temperature of the packaging of the device or its ambient temperature and then obtaining, by an experiment or analysis, the thermal resistance from the portion showing the maximum temperature to the portion where the temperature is actually measured.

However, the conventional method for measuring the temperature of a high-power device has some problems that it is difficult to obtain an accurate maximum temperature because of a difficulty in obtaining an accurate thermal resistance, and a real-time temperature cannot be found since there exists a delay in heat transfer between a maximum temperature point and a temperature measurement point. Additionally, there is a problem that the step of an experiment or analysis for obtaining a thermal resistance is added.

DISCLOSURE OF INVENTION

Technical Problem

Therefore, the present invention has been proposed to solve the above-described problems of the prior art, and has the following objects.

First, it is an object of the present invention to provide a high-power device having a thermocouple embedded therein, which is capable of detecting the temperature of a heating element that generates a maximum temperature in the high-power device in real-time.

Second, it is another object of the present invention to provide a high-power device having a thermocouple embedded therein. The high-power device can increase accuracy in detecting the temperature of a heating element that emits heat of a maximum temperature in the high-power device.

Third, it is still another object of the present invention to provide a method for manufacturing the above-described high-power device.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a high-power device, including: a heating element; a thermocouple formed adjacent to the heating element; and a dielectric body formed between the heating element and the thermocouple.

In accordance with another aspect of the present invention, there is provided a high-power device, including: a first substrate; a thermocouple formed on the first substrate; a second substrate formed on the first substrate so as to cover the thermocouple; and a gate electrode formed on the second substrate so as to correspond to the thermocouple.

In accordance with another aspect of the present invention, there is provided a method for manufacturing a high-power device, which includes the steps of: a) forming a first thin film on a first substrate; b) forming a second thin film, one end of which is joined to the first thin film to form a thermocouple with the first thin film; c) forming a second substrate on the first substrate so as to cover the first and the second thin films; and d) forming a gate electrode on the second substrate so as to correspond to the junction of the first and the second thin films.

The present invention makes it possible to accurately measure the temperature of a maximum temperature portion, which is the actual object to be controlled, in real-time by forming a thin film-type thermocouple adjacent to a heating element of a high-power device. Also, since the temperature of the heating element is measured in a spot closest to the heating element, a work for acquiring a thermal resistance value between the heating element and a temperature measuring device.

In addition, inaccuracy of the measured temperature caused by the inaccuracy of the thermal resistance value is reduced. Since the distance between the heating element and the temperature measuring device is relatively shorter than that in a conventional method, variation in temperature of the heating element can be detected in real-time, which eliminates a process of affixing a temperature measuring device.

Advantageous Effects

As discussed above and will be described below, according to the present invention, the following effects can be achieved.

First, according to the present invention, since a thermocouple is inserted into a high-power device, there is no need to mount a temperature measuring device on the outside of the high-power device in order to measure the temperature of the high-power device.

Second, according to the present invention, since a thermocouple is formed on the periphery of a heating element so as to be adjacent to the heating element in the high-power device, the temperature of the maximum temperature portion of the high-power device can be stably measured.

By this, as compared to the conventional method of not directly measuring the temperature of the maximum temperature portion of a high-power device but partially depending on calculations, an error of measurement can be reduced, and a thermal resistance measurement or analysis operation for calculating the temperature of the maximum temperature portion of a high-power device can be omitted. Further, because a thermocouple is formed as close as possible to the maximum temperature portion of the high-power device, it is possible to solve the problem of delay in temperature measurement caused by a thermal time lag between the maximum temperature portion and a temperature measuring portion.

Third, according to the present invention, because a thermocouple is formed along with a high-power device by using a semiconductor process, the thermocouple can be positioned very precisely even at a very narrow region, thereby precisely measuring the temperature of the device of which temperature increases very locally.

BEST MODE FOR CARRYING OUT THE INVENTION

Hereinafter, a preferred embodiment of the present invention will be described in detail with reference to the accompanying drawings so that the invention can be readily carried out by a person skilled in the art. Further, the same reference numerals are denoted for the same components throughout the specification.

Embodiment

Figure 3:
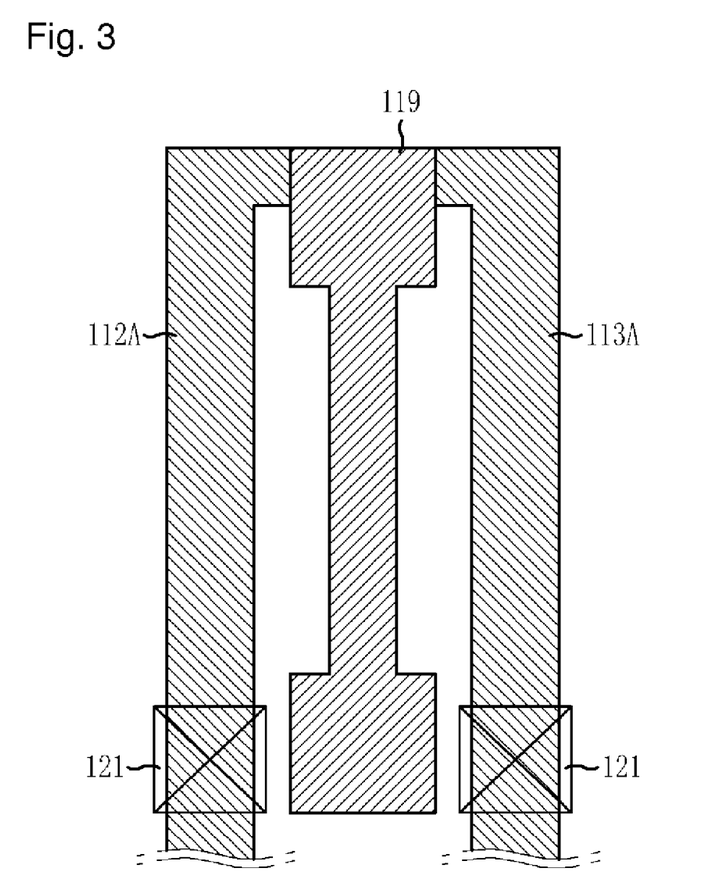
FIGS. 3 and 13 are a plane view showing a high-power device having a thermocouple embedded therein in accordance with an embodiment of the present invention.
Figure 4:
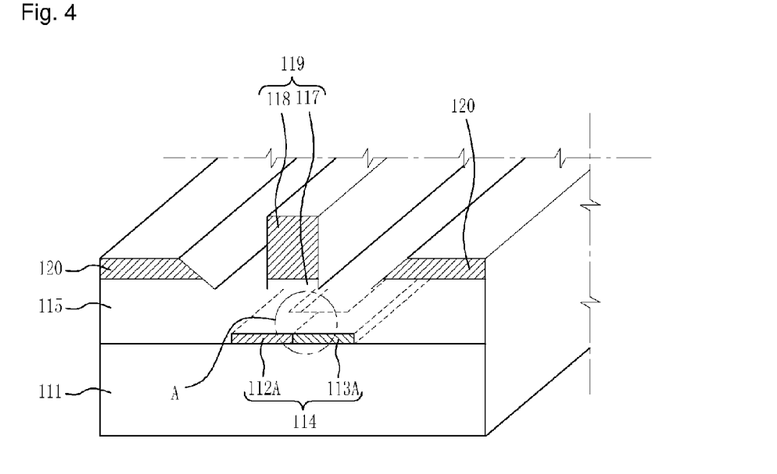
FIG. 4 is a cross-sectional perspective view of the high-power device shown in FIGS. 3 and 13.
Figure 13:
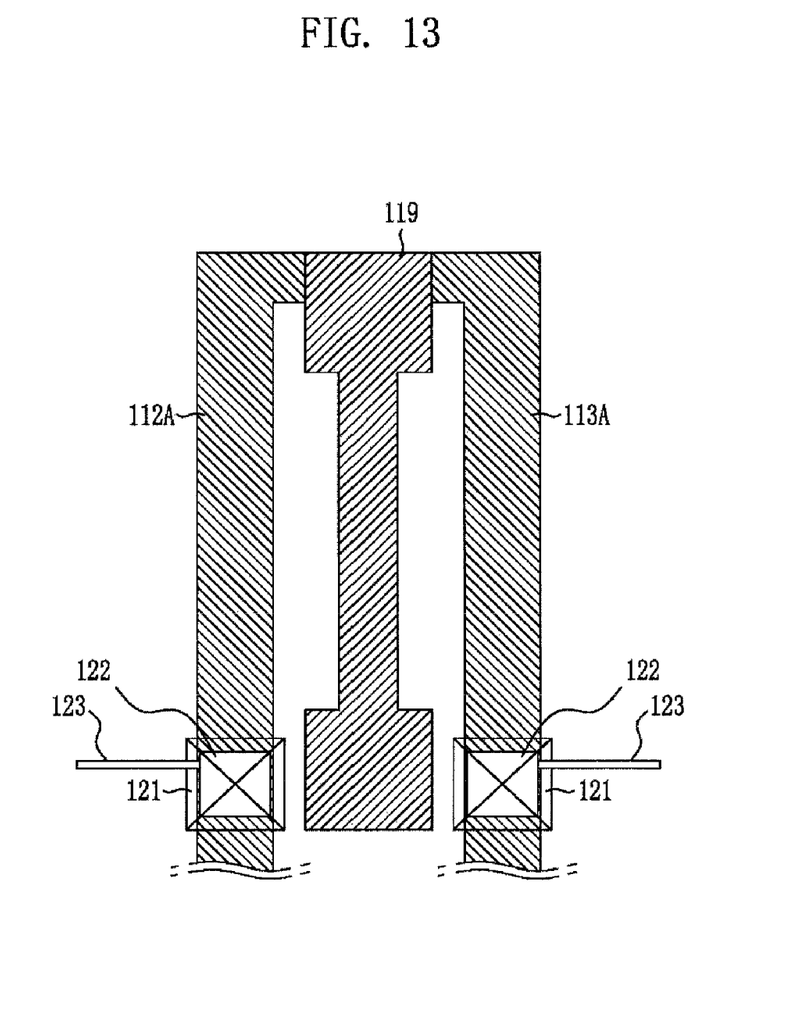

FIGS. 3 and 13 are a plane view explaining a high-power device having a thermocouple embedded therein in accordance with an embodiment of the present invention. FIG. 4 is a cross-sectional perspective view of the high-power device shown in FIGS. 3 and 13. Here, a description will be made by way of an example in which the heating element of the high-power device is a transistor.

Referring to FIGS. 3, 13, and 4, the high-power device in accordance with the embodiment of the present invention is provided with a thermocouple 114 formed between semiconductor substrates 111 and 115 of a laminate structure so as to correspond to a gate electrode 119 of a transistor. The thermocouple 114 has a structure in which the tip ends of first and second thin films 112A and 113A made of two kinds of metals or alloys are formed in a structure joined to each other and a portion A joined to each other is overlapped with the center part of the gate electrode 119 (which is the center part in a short axis direction in the drawing).

The first thin film 112A is one side of the thin films of the thermocouple 114, and is formed of metals or alloys on the top of the semiconductor substrate 111 by a thin film formation method, such as Chemical Vapor Deposition (CVD), Physical Vapor Deposition (PVD), Atomic Layer Deposition (ALD), ion plating, electroplating, evaporating, etc., and an etching process using a lithography process or the like.

The second thin film 113A is the other side of the thin films of the thermocouple 114, and is formed of metals or alloys by a thin film formation method and an etching process similar to those of the first thin film 112A. Further, the second thin film 113A is formed such that the tip end thereof is joined to one end of the first thin film 112A previously formed to make the joined portion A function as a hot junction of the thermocouple 114, whereby two metals or alloys form the thermocouple 114 joined to each other on the semiconductor substrate 111.

By using the above-described method, a plurality of thermocouples 114 can be formed at a predetermined position on the top of the semiconductor substrate 111 by a single process. The thermocouples 114 thus formed sensitively react with a temperature change of the gate electrode 119 at their respective positions. At this time, the joined portions A of the thermocouples 114 are formed such that they are positioned at the portions corresponding to the center parts of the gate electrodes 119. This is because, in case of a galluium arsenide high-power device, the power consumption is the highest just below the gate electrodes 119 of the transistors. In addition, this is because the maximum temperature is shown at the middle gate electrode among the plurality of gate electrodes and at a middle point of the entire width of the middle gate electrode. Accordingly, the joined portions A of the thermocouples 114, which are the portions for measuring a temperature, are disposed to be in the middle of the width of the gate electrodes 119 positioned at the center.

Meanwhile, the thermocouples 114 may be formed in a direction parallel to the long axis direction of the gate electrodes 119 or in a direction perpendicular thereto. These thermocouples 114 can be connected to an external control line only when they are connected to the surface, and thus they are connected to via contacts 121. That is, the thermocouples 114 are connected to junction pads 122A, 122B formed on the surface of the high-power device through via contacts 121, and the junction pad is connected to a lead frame.

The operating principle of these thermocouples 114 will be briefly described below. As shown in FIG. 4, when the tip ends of the first and second thin films 112A and 113A made of two kinds of metals or alloys are joined to each other and the temperatures of two sides of the hot junction A are made different, a thermoelectromotive force is generated between the two sides of the hot junction A by a seebeck effect, and thus a thermal current flows. At this time, the thermoelectromotive force is determined by the physical properties of the two kinds of thin films 112A and 113A and a temperature difference between the two sides of the hot junction A. An electromotive force is measured by measuring such a thermal current by a voltmeter. As the measured electromotive force is proportional to the temperature, the temperature can be measured after all.

For example, in case of the thermocouple 114 in which the first thin film 112A is made of copper and the second thin film 113A is made of constantan (an alloy of 60 percent copper and 40 percent nickel), when one junction is maintained at 0° C. and the other junction is maintained at 100° C., thermal current flows to the copper side through the junction of 100° C. At this time, the thermoelectromotive force is about 4.24 mV. Even though the middle part of the circuit is cut off and another third metal is connected thereto while keeping the temperatures of the junctions constant, respectively, if the temperatures of both connecting points are made equal, the thermoelecromotive force does not change. By using this phenomenon, the thermoelectromotive force can be measured by using a millivoltmeter or more precise potentiometer. For instance, the types of the thermocouple 114 include an alloy of platinum and rhodium (Type B), Chromel-Alumel (Type K), Iron-Constantan (Type J), Copper-Constantan (Type T) and so on.

Hereinafter, a method for manufacturing the high-power device having a thermocouple embedded therein in accordance with the embodiment of the present invention shown in FIG. 4 will be described with reference to FIGS. 5 to 12. FIGS. 5 to 12 are process cross-sectional views.

Figure 5:
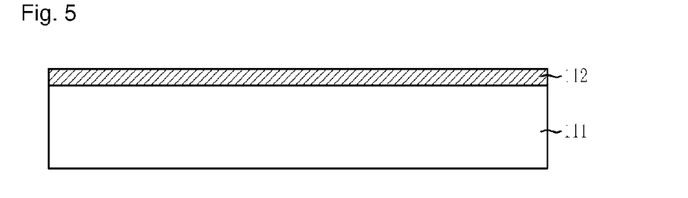
FIGS. 5 to 12 are process cross-sectional views explaining a method for manufacturing the high-power device shown in FIG. 4.

First, referring to FIG. 5, a first thin film material 112 is deposited on a semiconductor substrate 111 (hereinafter, referred to as a first substrate). At this time, the first thin film material 112 is made of a metal or alloy.

Figure 6:
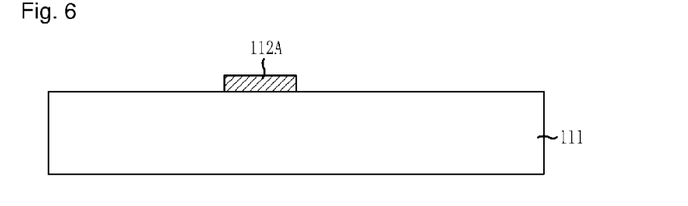

Subsequently, referring to FIG. 6, a photosensitive film (not shown) is coated on the first thin film material 112 (refer to FIG. 5), and then an exposure and development process using a photo mask is conducted to form a photosensitive pattern (not shown).

Next, an etching process using the photosensitive pattern as an etching mask is carried out to etch the first thin film material 112. At this time, both dry etching and wet etching processes can be used as the etching process. Thus, the first thin film 112A is formed on the first substrate 111.

Figure 7:
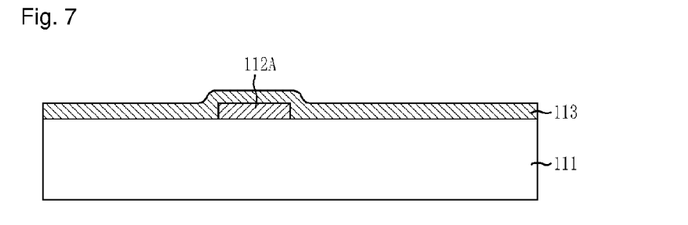

Thereafter, as shown in FIG. 7, a second thin film material 113 is deposited on the top surface of the entire structure including the first thin film 112A. At this time, the second thin film material 113 is made of a metal or alloy, and preferably formed of a material having a different thermal conductivity from that of the first thin film 112A.

Figure 8:
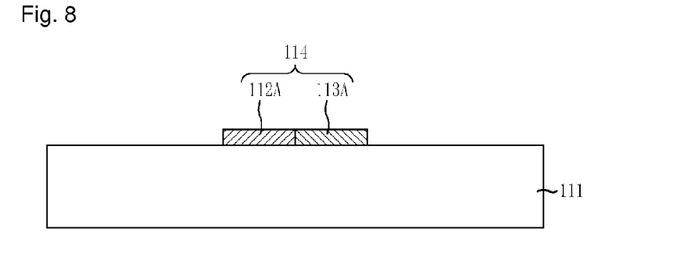

Next, as shown in FIG. 8, a photosensitive film (not shown) is coated on the second thin film material 113 (refer to FIG. 7), and then an exposure and development process using a photo mask is carried out to form a photosensitive pattern (not shown).

Subsequently, an etching process using the photosensitive pattern is performed to etch the second thin film material 113. At this time, both dry etching and wet etching processes can be used as the etching process. Thus, a second thin film 113A is formed on the first substrate 111 in a direction parallel to the first thin film 112A. At this time, the second thin film 113A is etched such that one end thereof is joined to the first thin film 112A.

Figure 9:
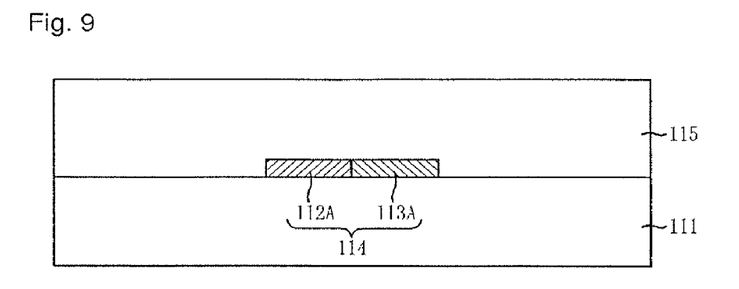

Subsequently, as shown in FIG. 9, a semiconductor substrate 115 (hereinafter, referred to as a second substrate) is formed on the top surface of the entire structure so as to cover the thermocouple 114 consisting of the first and second thin films 112A and 113A. At this time, the second substrate 115 may be formed by an epitaxy process.

Figure 10:
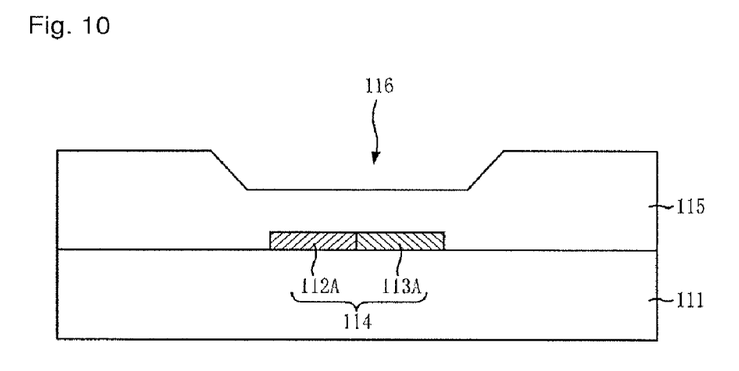

Next, as shown in FIG. 10, a photosensitive film (not shown) is coated on the second substrate 115, and then an exposure and development process using a photo mask is carried out to form a photosensitive pattern (not shown).

Thereafter, the second substrate 115 is recessed at the portion corresponding to the top part of the thermocouple 114 by a predetermined depth by conducting an etching process using the photosensitive pattern. This is for minimizing the gap between a subsequent gate electrode 119 (refer to FIG. 11) and the thermocouple 114 so that heat generated from the gate electrode is transferred to the thermocouple 114 without almost consumption. Thus, a recess groove 116 is formed on the second substrate 115 corresponding to the top part of the thermocouple 114.

Figure 11:
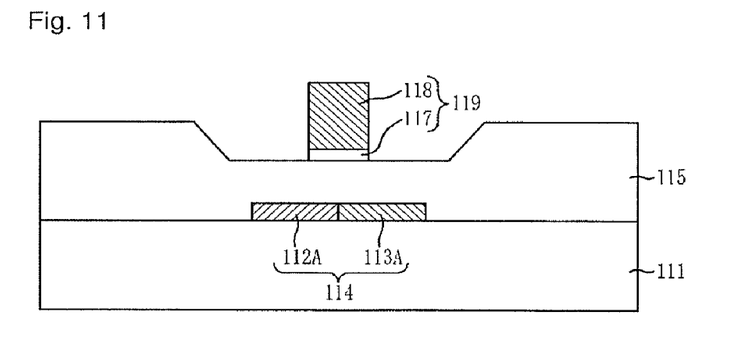

Subsequently, as shown in FIG. 11, a gate oxide film 117 and a polysilicon layer 118 are sequentially formed within the recess groove 116, and then sequentially patterned by an etching process to form a gate electrode 119. At this time, the center portion of the gate electrode 119 is aligned with a hot junction A (refer to FIG. 4) of the first and the second thin films 112A and 113A.

Figure 12:
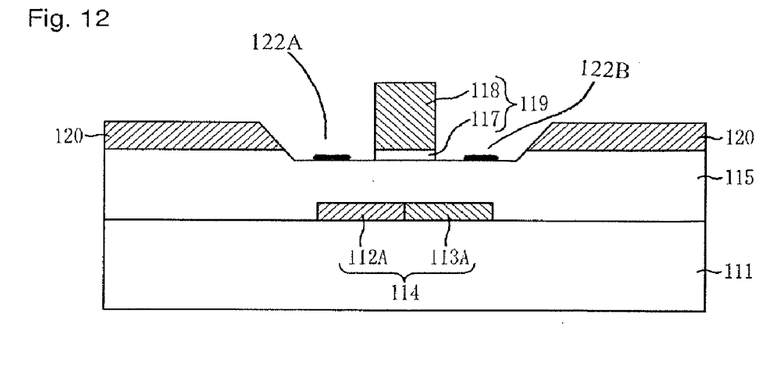

In succession, as shown in FIG. 12, an impurity ion implantation process is carried out in the second substrate 115 exposed to both sides of the gate electrode 119 to form source and drain regions 120.

Next, an interlayer insulating film (not shown) is deposited so as to cover the source and drain regions 120. At this time, the interlayer insulating film may be formed of a single layer of an oxide film or a laminate structure of at least two layers thereof. In some cases, a predetermined semiconductor structure may be formed on each layer.

Lastly, the interlayer insulating film is etched to form a via (not shown) exposing parts of the thermocouple 114, and thereafter, a via contact 121 (refer to FIG. 3) is formed by using a metal or alloy film and then pads 122A, 122B for connecting to an external lead frame is formed on the via contact 121.

Although the technical spirit of the present invention has been specifically described in the preferred embodiment so far, it should be noted that the preferred embodiment is only for exemplifying the present invention, but not for limiting the present invention. Especially, although the embodiment has been described only with respect to a method for forming a thermocouple on the bottom part of a gate electrode, this is only for example and a thermocouple may be formed on the surface of a high-power device having a plurality of circuit patterns formed therein. That is, in the present invention, the thermocouple is preferably formed at a portion most adjacent to the top, bottom, left, and right of a heating element of the high-power device, wherein the thermocouple and the heating element are formed such that they are electrically insulated through a dielectric body.

The present application contains subject matter related to Korean Patent Application No. 2006-0094656, filed in the Korean Intellectual Property Office on Sep. 28, 2006, the entire contents of which is incorporated herein by reference.

While the present invention has been described with respect to the specific embodiments, it will be apparent to those skilled in the art that various changes and modifications may be made without departing from the spirit and scope of the invention as defined in the following claims.

The invention claimed is:

1. A high-power device, comprising:
a heating element;
a thermocouple formed adjacent to the heating element;
a dielectric body formed between the heating element and the thermocouple;
wherein the thermocouple includes first and second thin films made of two kinds of metals and alloys;
wherein one end of each the first and the second thin films are joined to each other to form a hot junction;
a via contact connected to the thermocouple; and
a pad for connecting the via contact to an external lead frame;
wherein, a temperature difference of two sides of the hot junction in the first and the second thin films of the thermocouple causes a thermoelectromotive force to be generated between the two sides of the hot junction by a seebeck effect, a thermal current flows according to the thermoelectromotive force, such that a temperature of the high-power device is measured by measuring the thermal current;
wherein the thermoelectromotive force is determined by a temperature difference between the two sides of the hot junction; and
wherein the measured thermoelectromotive force is proportional to the temperature.

2. The high-power device of claim 1, further comprising:
a first substrate;
a second substrate; and
a gate electrode;
wherein the thermocouple is formed on the first substrate;
wherein the second substrate is formed on the first substrate so as to cover the thermocouple;

wherein the gate electrode is formed on the second substrate so as to correspond to the thermocouple.

3. The high-power device of claim 2, wherein a recess groove is formed on the second substrate at a portion corresponding to the thermocouple.

4. The high-power device of claim 1, wherein a center part of the heating element is aligned to correspond to the hot junction.

* * * * *